(12) United States Patent
Sugiyama et al.

(10) Patent No.: US 8,525,525 B2
(45) Date of Patent: Sep. 3, 2013

(54) CONDUCTIVITY TEST JIG, CONDUCTIVITY TEST APPARATUS HAVING CONDUCTIVITY TEST JIG, AND A METHOD OF TESTING CONDUCTIVITY

(75) Inventors: Akira Sugiyama, Shizuoka (JP); Hiroshi Takeuchi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 212 days.

(21) Appl. No.: 12/292,516

(22) Filed: Nov. 20, 2008

(65) Prior Publication Data
US 2009/0134888 A1    May 28, 2009

(30) Foreign Application Priority Data
Nov. 26, 2007  (JP) ................. 2007-304225

(51) Int. Cl.
*G01R 31/04*    (2006.01)
(52) U.S. Cl.
USPC . 324/538; 414/803; 324/750.16; 324/756.05; 324/158.1
(58) Field of Classification Search
USPC ........................................................ 324/538
See application file for complete search history.

(56) References Cited

U.S. PATENT DOCUMENTS

| | | | | |
|---|---|---|---|---|
| 4,742,612 A | * | 5/1988 | Dokan et al. | 29/739 |
| 5,122,070 A | * | 6/1992 | Lebris et al. | 439/140 |
| 5,498,966 A | | 3/1996 | Yamamoto | |
| 5,689,191 A | * | 11/1997 | Kashiyama | 324/538 |
| 5,777,480 A | * | 7/1998 | Hatagishi et al. | 324/538 |
| 5,868,545 A | * | 2/1999 | Kasai et al. | 414/808 |
| 6,116,935 A | * | 9/2000 | Fukuda | 439/310 |
| 6,157,197 A | | 12/2000 | Iwasaki | |
| 6,480,004 B1 | * | 11/2002 | Iwasaki | 324/538 |
| 6,489,780 B2 | * | 12/2002 | Yoshida | 324/538 |

(Continued)

FOREIGN PATENT DOCUMENTS

| | | |
|---|---|---|
| JP | 5-288792 | 11/1993 |
| JP | 7-037448 | 2/1995 |
| JP | 2001-66343 | 3/2001 |
| JP | 2007-85926 A | 4/2007 |

OTHER PUBLICATIONS

Office Action dated Feb. 24, 2011, issued for the corresponding Chinese patent application No. 200810170350.7 and English translation thereof.

(Continued)

*Primary Examiner* — Melissa Koval
*Assistant Examiner* — Benjamin M Baldridge
(74) *Attorney, Agent, or Firm* — Edwards Wildman Palmer LLP; James E. Armstrong, IV; Stephen D. LeBarron (57) ABSTRACT

The conductivity test jig includes: a jig main body; a holding member; a conductivity test unit; a conductivity member; an air cylinder; a jig main body; and a second air cylinder. The jig main body has a hole for receiving the connector. The holding member holds the connector in the hole. The conductivity test unit is detachably attached to the connector. When the conductivity test unit moves close to the connector, the conductivity member is electrically connected to the terminals of the connector. The air cylinder makes the conductivity test unit contact the connector, and removes the conductivity test unit from the connector. The push-out member is interposed between the connector and the jig main body in an insertion direction of the connector in the hole. The second air cylinder moves the push-out member in the insertion direction.

5 Claims, 10 Drawing Sheets

(56) References Cited

U.S. PATENT DOCUMENTS

| | | | |
|---|---|---|---|
| 7,042,239 B1* | 5/2006 | Miller | 324/756.05 |
| 7,227,365 B2* | 6/2007 | Machado | 324/537 |
| 7,253,638 B2* | 8/2007 | Nakamura et al. | 324/538 |
| 2001/0007425 A1* | 7/2001 | Yoshida | 324/538 |
| 2002/0172734 A1* | 11/2002 | Stevens | 425/437 |
| 2003/0062888 A1* | 4/2003 | Magliocco et al. | 324/158.1 |
| 2004/0189281 A1* | 9/2004 | Le et al. | 324/158.1 |
| 2006/0097714 A1* | 5/2006 | Machado | 324/158.1 |
| 2006/0097739 A1* | 5/2006 | Machado | 324/755 |
| 2007/0039167 A1* | 2/2007 | Gosis et al. | 29/745 |
| 2008/0180110 A1* | 7/2008 | Jackson | 324/537 |
| 2009/0237100 A1* | 9/2009 | Namiki et al. | 324/754 |

OTHER PUBLICATIONS

Office Action dated Apr. 17, 2009, issued for the corresponding Portuguese patent application No. 104225.

Office Action dated Jul. 3, 2012, issued for the corresponding Japanese patent application No. 2007-304225 and English translation thereof.

* cited by examiner

CONDUCTIVITY TEST JIG, CONDUCTIVITY TEST APPARATUS HAVING CONDUCTIVITY TEST JIG, AND A METHOD OF TESTING CONDUCTIVITY

CROSS REFERENCE TO RELATED APPLICATIONS

This application is on the basis of Japanese Patent Application No. 2007-304225, the contents of which are hereby incorporated by reference.

BACKGROUND OF THE INVENTION

1. Field of the Invention

The present invention relates to a conductivity test jig, a conductivity test apparatus, and a method of testing conductivity.

2. Description of the Related Art

Conventionally, quality of a wiring harness is judged by testing conductivity between terminals, wherein the wiring harness includes a plurality of electric wires and terminals attached to ends of the electric wires, and connectors receiving the terminals.

Conventionally, a method of testing conductivity of such a wiring harness includes steps described below. Firstly, one of the terminals of the wiring harness is selected, and a voltage is applied to the one terminal, then, voltages of other terminals are measured. Voltage is applied to all the terminals sequentially, and in each case, voltages of the other terminals are measured sequentially. Thus, mutual conductivity conditions of all the terminals are figured out.

By comparing the measured mutual conductivity conditions of the terminals with the mutual conductivity conditions of the terminals of a normal wiring harness, the quality of the wiring harness is judged, and a trouble point is detected.

For testing conductivity of the wiring harness, various conductivity test jigs are used (for example, see Patent Document 1). The conductivity test jig disclosed in Patent Document 1 includes: a jig main body to receive a connector and having a hole opened on an outer surface; a rotating piece rotatably mounted on the jig main body; and a solenoid.

A conductivity pin is projected in an interior of the hole of the jig main body. The conductivity pin is inserted into a through hole formed in the jig main body, and into a compression coil spring which is inserted into the through hole. The conductivity pin is pushed toward the hole by the compression coil spring, and provided projectably and retractably from the through hole.

An end of the rotating piece is formed in a hook shape. The rotating piece is rotatable between a position where the end is projected into the hole and a position where the end is removed from the hole. The solenoid includes: a solenoid main body attached to the jig main body; and a rod projectably and retractably mounted on the solenoid main body.

When a conductivity test is carried out using the above described conductivity test jig, firstly, the connector is inserted into the hole to make the terminal of the connector contact the conductivity pin, and the connector is pushed into the conductivity test jig. Then, the terminal resiliently deforms the compression coil spring and the conductivity pin is partially inserted into the through hole. Under this condition, the solenoid rod is extended and the end of the rotating piece is projected into the hole to keep the connector in the hole, then the conductivity test is performed.

After the conductivity test ends, the solenoid rod is contracted to release the end of the rotating piece from the hole.

Then, due to the resilient force of the compression coil spring, the conductivity pin pushes up the terminal of the connector, and the connector is released out from the hole.

The conductivity test jig as such is projectingly attached to a rear wall (a lower wall) of a wiring board on a surface of which the wiring harness is wired. Therefore, compared with a conductivity test jig which is attached to a front wall of the wiring board (See Patent Document 2), This conductivity test jig prevents the connector or the wiring harness from being damaged by interfering with the conductivity test jig, and good workability is provided because the electric wire may not be hooked on the conductivity test jig.

Further, because such a conductivity test jig moves perpendicular to the wiring board, when a plurality of connectors are massed at a part of the wiring harness, and a plurality of conductivity test jigs corresponding to the connectors are attached to the wiring board, each conductivity test jig is not interfered with the other conductivity test jigs when they are moving, and conductivity test is performed effectively.

[Patent Document 1] Japanese Published Patent Application No. H05-288792

[Patent Document 2] Japanese Published Patent Application No. H07-37448

However, according to the conductivity test jig described in Patent Document 1, the connector is pushed into the hole to make the terminal of the connector contact the conductivity pin so that the compression coil spring is resiliently deformed. Further, after the conductivity test ends, the conductivity pin pushes up the terminal to push the connector out of the hole. Therefore, there is a problem that the terminal and the conductivity pin are burdened, and the terminals and the conductivity pin may be deformed or damaged. Further, because the connector is pushed so that the connector is inserted into the hole, workability is not good.

Accordingly, an object of the present invention is to provide a conductivity test jig to test in which the terminal and the conductivity pin are not burdened so much, and a connector can be easily detachably attached to the conductivity test jig, and to provide a conductivity test apparatus having the conductivity test jig, and a method of testing conductivity.

SUMMARY OF THE INVENTION

In order to attain the object, according to the present invention, there is provided a conductivity test jig for testing conductivity of a terminal of a connector including:

a jig main body having a hole opening on an outer surface thereof for receiving the connector;

a holding member for holding the connector received in the hole;

a conductivity test unit for removably contact the connector received in the hole;

a conductivity member mounted on the conductivity test unit for being electrically connected to the terminal when the conductivity test unit moves close to the connector;

a driving source for making the conductivity test unit abut on the connector and removing the conductivity test unit from the connector;

a push-out member interposed between the connector and the jig main body in the hole in a insertion direction of the connector; and a second driving source for moving the push-out member in the insertion direction.

Preferably, the jig main body includes:

a main body member; and a connector-receiving member having a concave for receiving the connector therein.

Preferably, the push-out member includes:

a push-out board facing a front wall of the connector received in the hole and having insertion holes into which the conductivity member having a plurality of conductivity pins is inserted; and a projection projected from the push-out board.

According to another aspect of the present invention, there is provided a conductivity test apparatus including:

a wiring board on a surface of which a wiring harness is arranged; and the conductivity test jig as described above.

According to another aspect of the present invention, there is provided a method of conductivity test for testing conductivity of a terminal of a connector including the steps of:

receiving and holding the connector in a hole in which a push-out member is received;

making a conductivity member abut on the terminal of the connector received in the hole;

testing conductivity of the terminal;

removing the conductivity member from the terminal; and moving the push-out member out of the hole to push the connector out of the hole.

These and other objects, features, and advantages of the present invention will become more apparent upon reading of the following detailed description along with the accompanied drawings.

DETAILED DESCRIPTION OF THE PREFERRED EMBODIMENTS

Hereunder a conductivity test apparatus 10 and a conductivity test jig 1 according to an embodiment of the present invention will be explained with reference to FIGS. 1 to 10. The conductivity test apparatus 10 is used when a wiring harness is arranged on a wiring board, and tested conductivity.

The wiring harness includes: a plurality of electric wires (not shown); terminals attached to ends of the electric wires (not shown); and a connector housing 15 for receiving the terminals. The wiring harness ties the electric wires in a desired shape, and is composed of a protector, a resin tube and a clip attached to a main part of the electric wires, or a tape wrapped around the main part of the electric wires.

Each electric wire is a so-called coated wire, and composed of a core wire made of conductive metal and a cover for covering the core wire made of insulating synthetic resin. The terminal is made by folding conductive plate metal. The terminal is electrically connected to the core wire of the electric wire.

Figure 5:
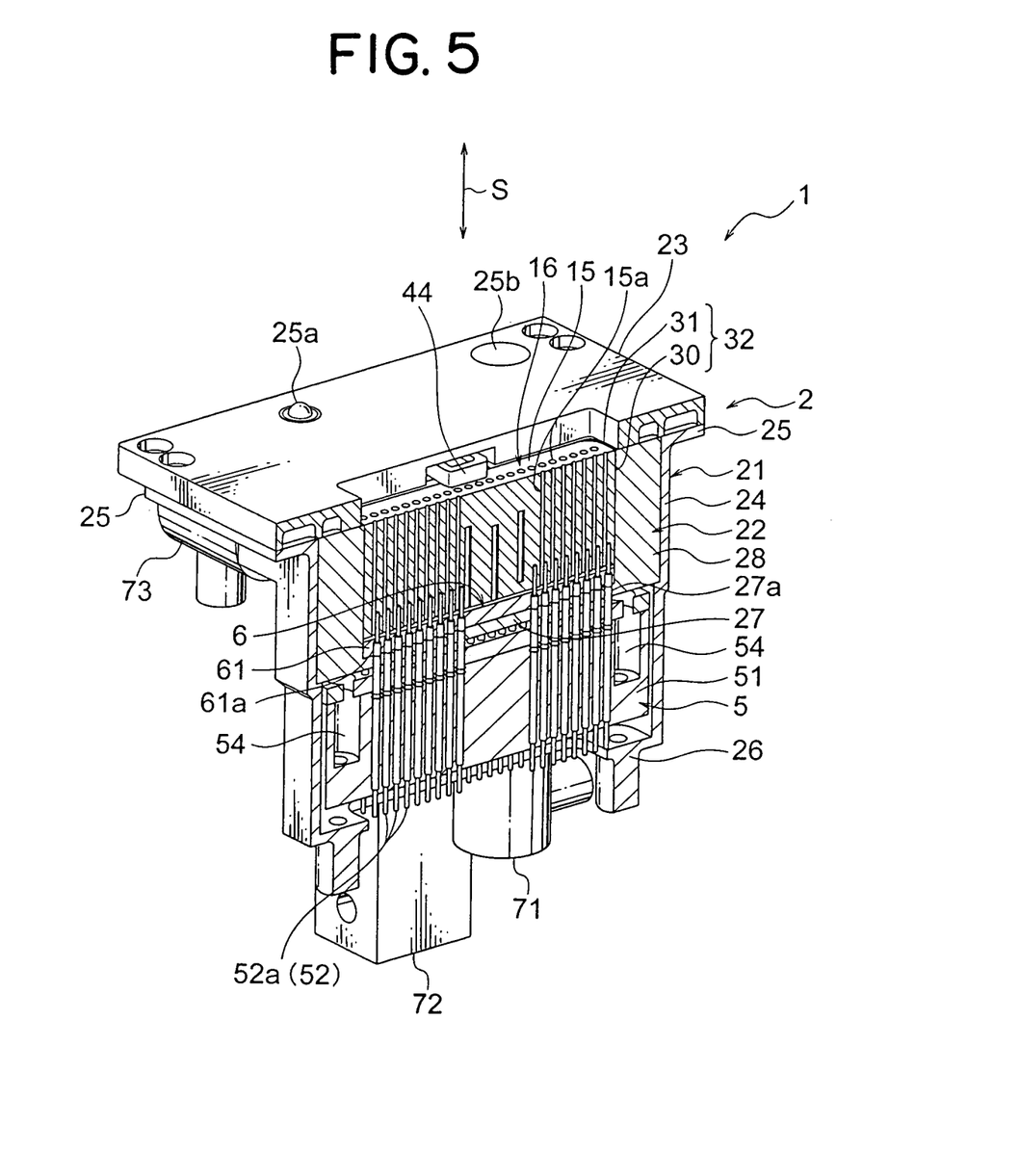
FIG. 5 is a sectional perspective view showing a conductivity test unit moving close to the connector and testing conductivity of the connector shown in FIG. 4.

The connector housing 15 is made of insulating synthetic resin or the like. As shown in FIG. 5, the connector housing 15 is formed in a box shape and includes a plurality of terminal receiving chambers 15a. An interior of the terminal receiving chamber 15a receives the terminal. The terminal receiving chamber 15a is a straightly extended space formed in the connector housing 15. Both ends of the terminal receiving chamber 15a are open on outer walls. A connector 16 is composed of the terminals and the connector housing 15 receiving the terminals. Namely, the wiring harness includes the connector 16.

Figure 1:
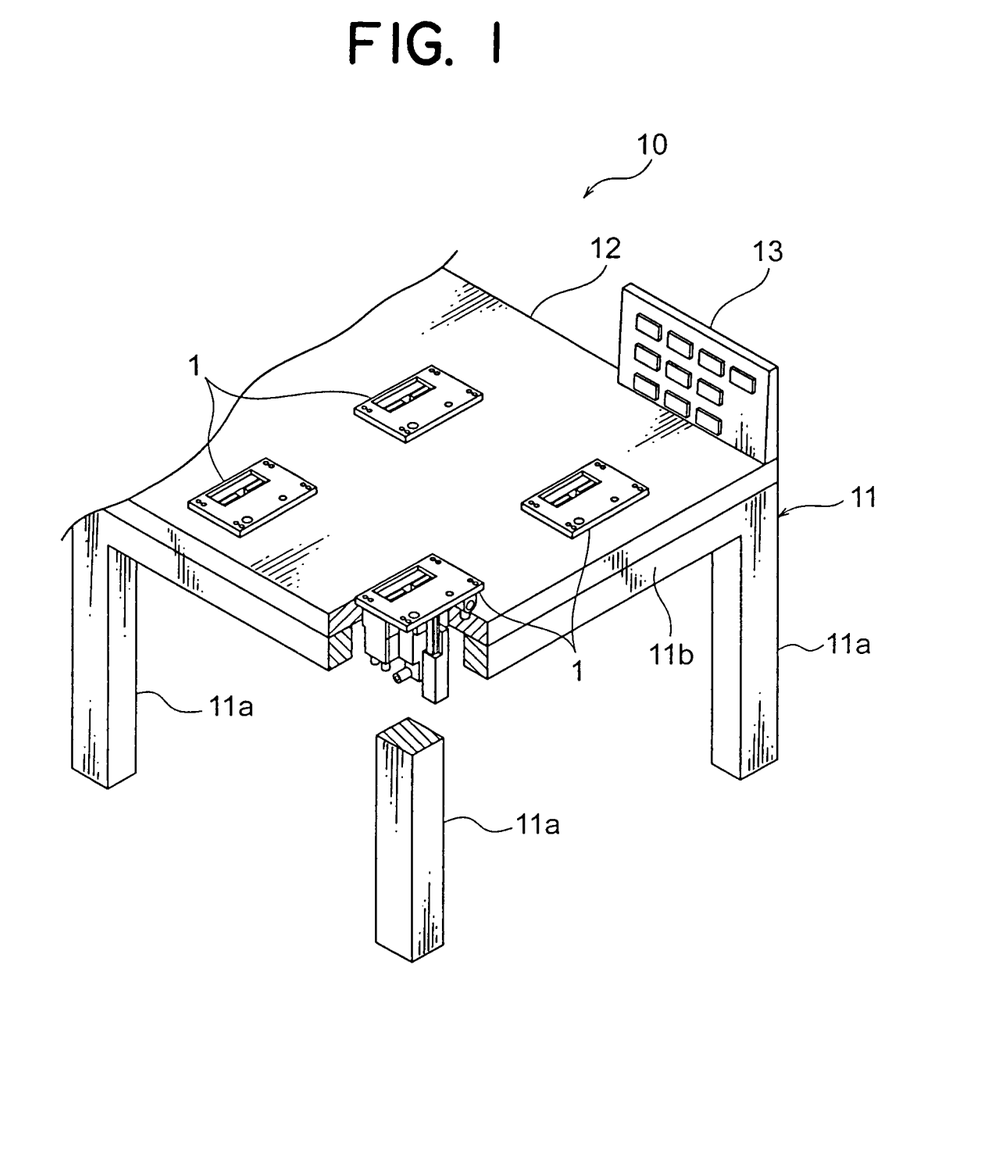
FIG. 1 is a schematic perspective view showing an embodiment of a conductivity test apparatus according to the present invention.

As shown in FIG. 1, the conductivity test apparatus 10 includes: a base 11; a wiring board 12; the conductivity test jig 1; and a controller 13. The base 11 is formed in substantially a table shape, and includes: a plurality of legs 11a vertically extended on a floor; and a frame 11b continued from the legs 11a. The wiring board 12 is formed in a rectangular plate shape, and attached to an upper wall of the frame 11b. Attaching holes are formed through the wiring board 12. The conductivity test jigs 1 are attached in the attaching holes.

Figure 2:
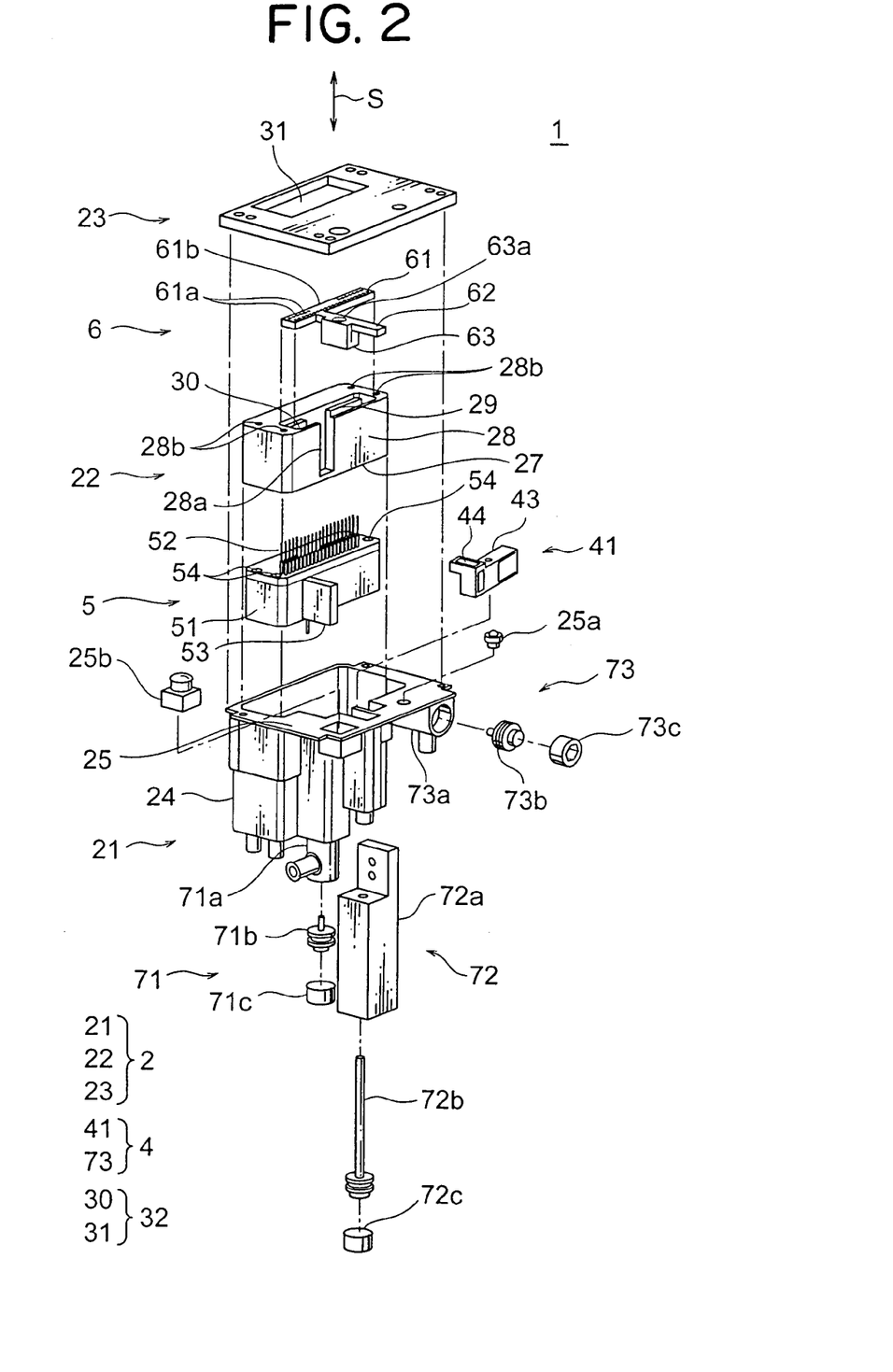
FIG. 2 is an exploded perspective view showing a conductivity test jig shown in FIG. 1.

The conductivity test jig 1 tests conductivity of the terminal of the connector 16. As shown in FIG. 2, the conductivity test jig 1 includes: a jig main body 2; a holding member 4; a conductivity test unit 5; a conductivity member 52; an air cylinder 71 (corresponding to the driving source); a push-out member 6; and a second air cylinder 72 (corresponding to the second driving source).

Figure 4:
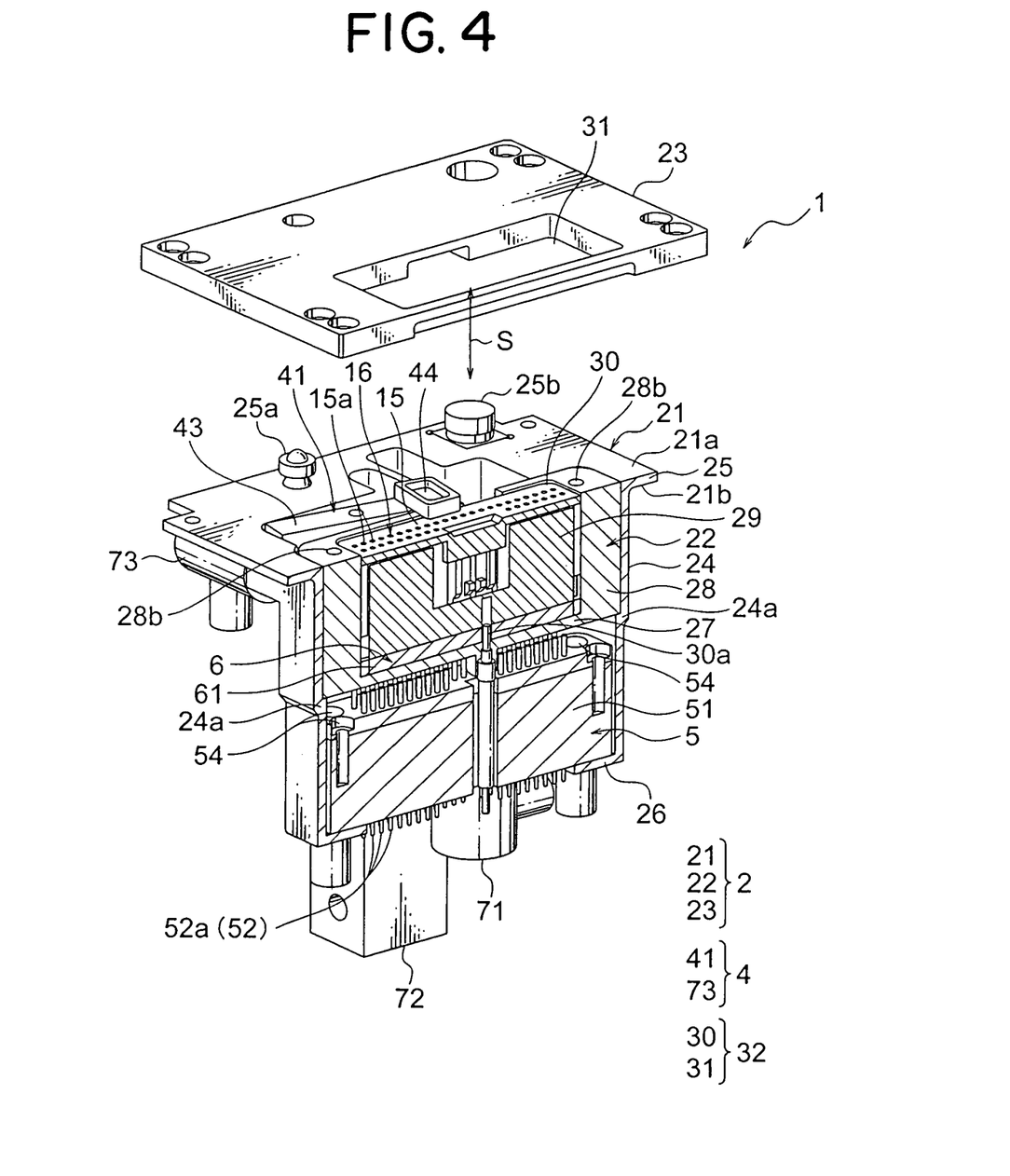
FIG. 4 is a sectional perspective view showing the connector shown in FIG. 3 that is held in a hole of the conductivity test jig.

The jig main body 2 includes: a main body 21; a connector receiving member 22; and a cover 23. The main body 21 is made of insulating synthetic resin or the like. As shown in FIG. 4, the main body 21 includes: a tubular receiver 24; a flat upper plate 25 extended from one end of the receiver 24; and a locking part 26 extended from the other end of the receiver 24.

The receiver 24 is so arranged as to open in a vertical direction (namely, an insertion direction S of the connector). An interior of the one end side of the receiver 24 receives the connector receiving member 22 and a later-described lock lever 41. An interior of the other end side of the receiver 24 receives the conductivity test unit 5. A locking projection 24a is formed in an inner wall of the receiver along a periphery of the receiver 24. A bottom wall of the connector receiving member 22 received in the receiver 24 is overlapped with the locking projection 24a.

The upper plate 25 is formed in a flange shape extended from the one end of the receiver 24, and formed in a rectangular shape in plan view. The upper plate 25 is arranged perpendicular to the receiver 24. An LED 25a and a button 25b are mounted on the upper plate 25.

The locking part 26 is projected toward an inside of the receiver 24 from the other end of the receiver 24. The locking part 26 is extended along a periphery of the receiver 24. A bottom wall of the conductivity test unit 5 received in the receiver 24 is overlapped with the locking part 26. A gap between the locking part 26 and the above-described locking projection 24a is wider than a height of the conductivity test unit 5 (in a vertical direction of FIG. 4).

The connector receiving member 22 is made of insulating synthetic resin. As shown in FIG. 4, the connector receiving member 22 is formed in a tubular shape and includes: a bottom wall 27; a peripheral wall extended from an outer edge of the bottom wall 27; and a partition wall 29 partitioning an interior of the peripheral wall 28.

As shown in FIG. 5, a plurality of insertion holes 27a are formed through the bottom wall 27 for inserting later-described conductivity pins 52a thereinto.

As shown in FIG. 2, a notch 28a extended straight toward the bottom wall 27 from a tip of the peripheral wall 28 and guide holes 28b are formed on the peripheral wall 28. The guide holes 28b penetrate the peripheral wall 28 in the vertical direction (namely, the insertion direction S).

The connector receiving member 22 receives the connector 16 in a space 30 (hereafter referred to as connector receiving hole corresponding to a concave) surrounded by the peripheral wall 28 having the notch 28a and the partition wall 29. A cross-sectional shape of the connector receiving hole 30 in the insertion direction S is constant. An inner diameter of the connector receiving hole 30 is larger than an outer diameter of the connector 16. In the connector receiving hole 30, a switch pin 30a is projected from a bottom wall of the connector receiving hole 30. The switch pin 30a detects whether the connector 16 is received in the connector receiving hole 30 or not.

Figure 3:
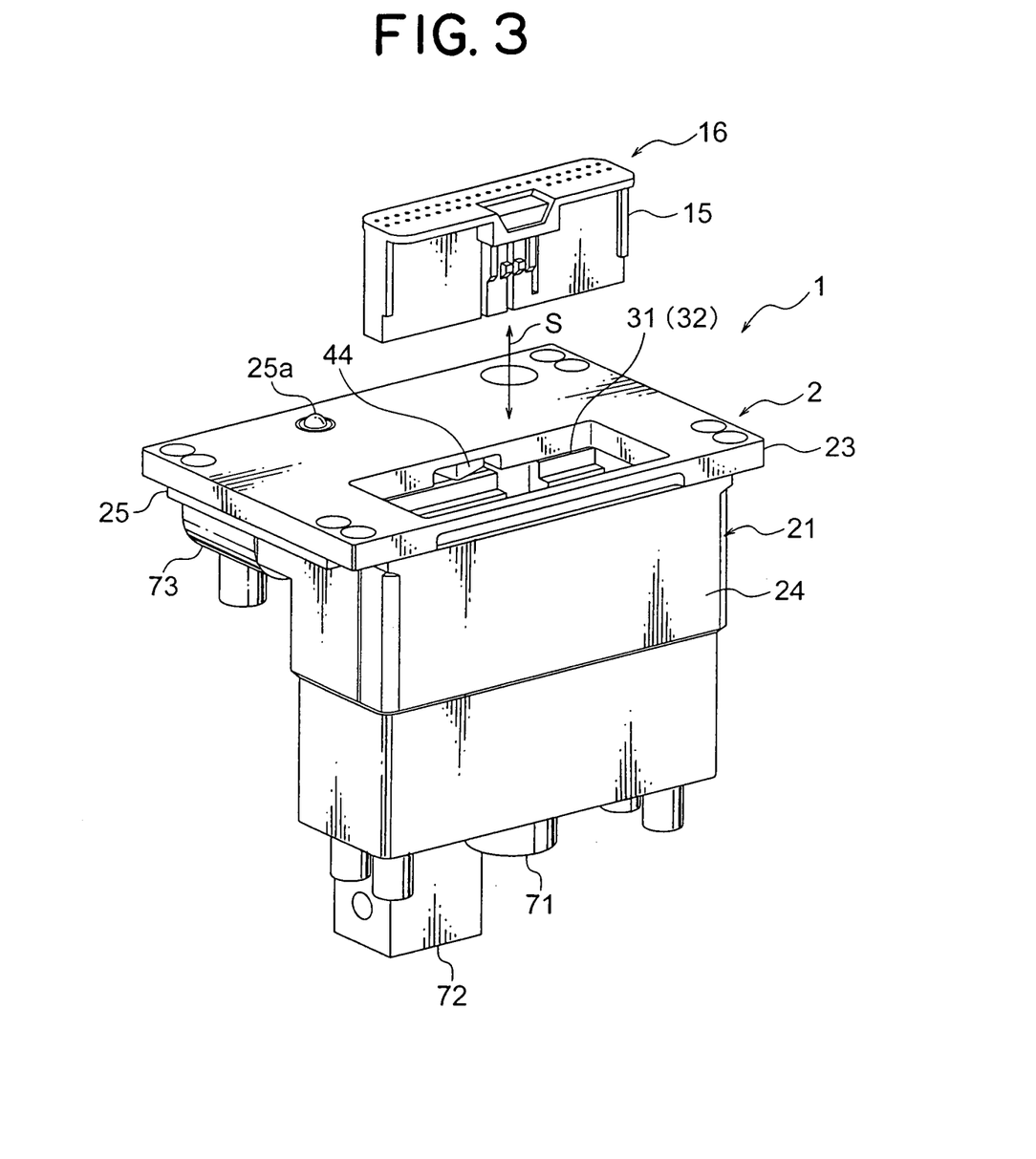
FIG. 3 is a perspective view showing the conductivity test jig shown in FIG. 1 before a connector is attached thereto.

The cover 23 is made of insulating synthetic resin or the like, and formed in a rectangular plate shape. As shown in FIGS. 3 and 4, the cover 23 is overlapped with the upper plate 25 of the main body 21 which receives the connector receiving member 22, the lock lever 41, and the conductivity test unit 5, and then attached to the main body 21. A size of the cover 23 is substantially same as the upper plate 25, and larger than an attaching hole of the wiring board 12. A through hole 31 continued to the connector receiving hole 30 of the connector receiving member 22 is formed on the cover 23. The through hole 31 and the connector receiving hole 30 compose a hole 32 for receiving the connector 16. Because the through hole 31 penetrates the cover 23, the hole 32, of course, opens on an upper wall of the cover 23 as an outer wall of the jig main body 2.

Further, a hole for attaching the cover 23 to the main body 21, a hole for fixing the conductivity test jig 1 to the base 11, and a hole for exposing the LED 25a and the button 25b mounted on the main body 21 are formed on the cover 23.

As shown in FIG. 2, the holding member 4 includes the lock lever 41, a coil spring (not shown), and a third air cylinder 73 as a third driving source. The lock lever 41 is made of insulating synthetic resin or the like. As shown in FIG. 4, the lock lever 41 is received in an interior of the receiver 24 of the main body 21, and disposed around an outer wall 21a (hereafter referred to as upper wall) of the main body 21 near the cover 23. The lock lever 41 is rotatably supported by the main body 21 about the center in a longitudinal direction thereof. The lock lever 41 is rotatable on a plane parallel to the upper wall 21a of the main body 21.

The lock lever 41 includes a rod-shaped lever main body 43 and a locking projection 44 extended from an end of the lever main body 43. The locking projection 44 is projected perpendicular to the longitudinal direction of the lever main body 43, and projected from an outer wall of the lever main body 43 away from the main body 21.

An end of the coil spring is attached to an end of the lever main body 43. The other end of the coil main body is attached to the upper wall 21a of the main body 21 further away from the connector receiving member 22 than the locking projection 44. The coil spring pushes the lock lever 41 in a direction that the locking projection 44 is moved close to the connector receiving member 22.

As shown in FIG. 2, the third air cylinder 73 includes: a cylinder main body 73a; a rod 73b projectably and retractably mounted on the cylinder main body 73a; and a plug 73c for sealing the cylinder main body 73a. The cylinder main body 73a is disposed on an outer wall 21b (hereafter referred to as a lower wall) of the main body 21 away from the cover 23, and parallel to the lower wall 21b. A tip of the rod 73b faces the other end of the lever main body 43. The third air cylinder 73 rotates the lever main body 43, namely, the lock lever 41 by expanding and contracting the rod 73b.

Figure 6:
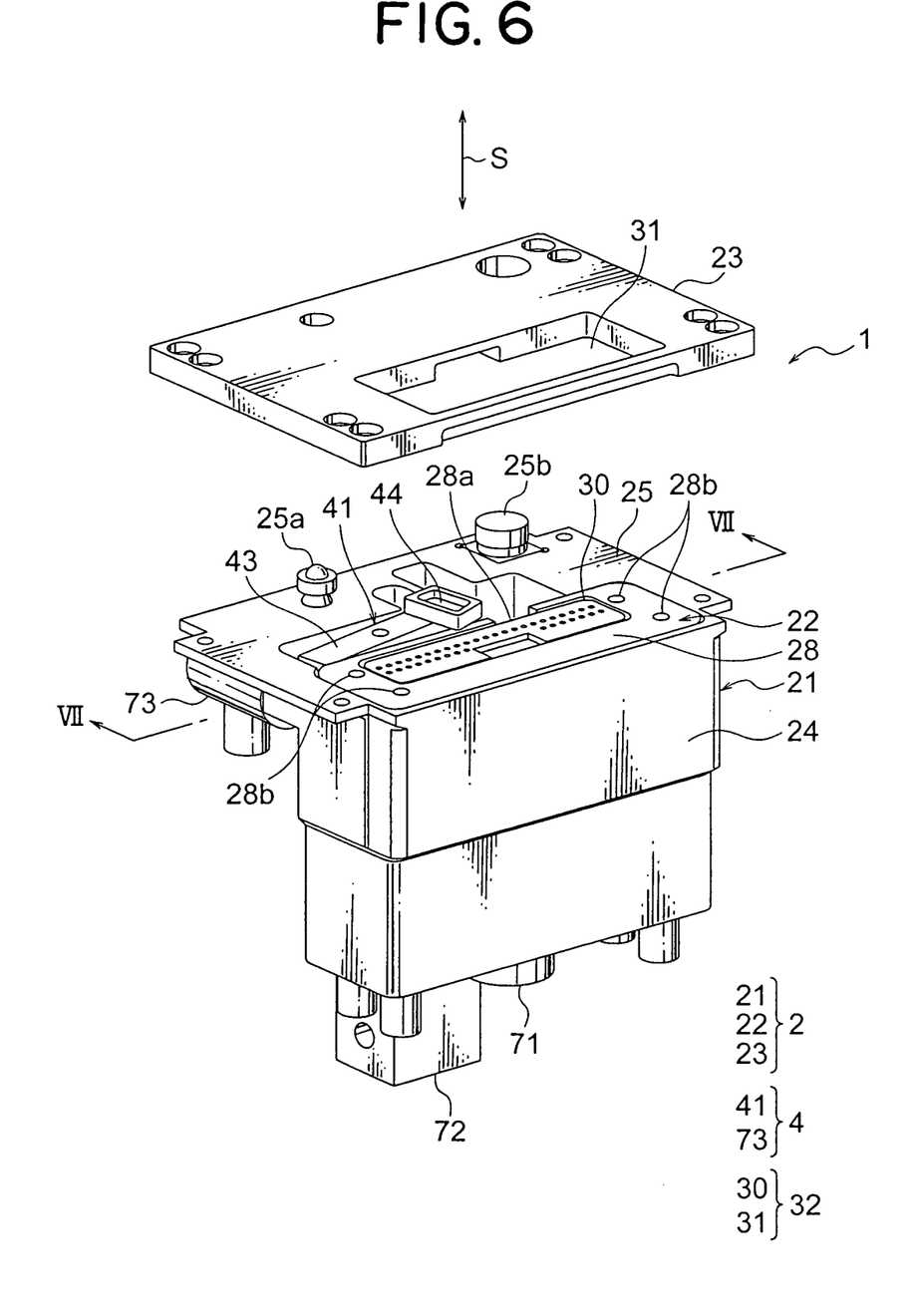
FIG. 6 is a perspective view showing a state that the conductivity test is ended and a lock lever is released.
Figure 7:
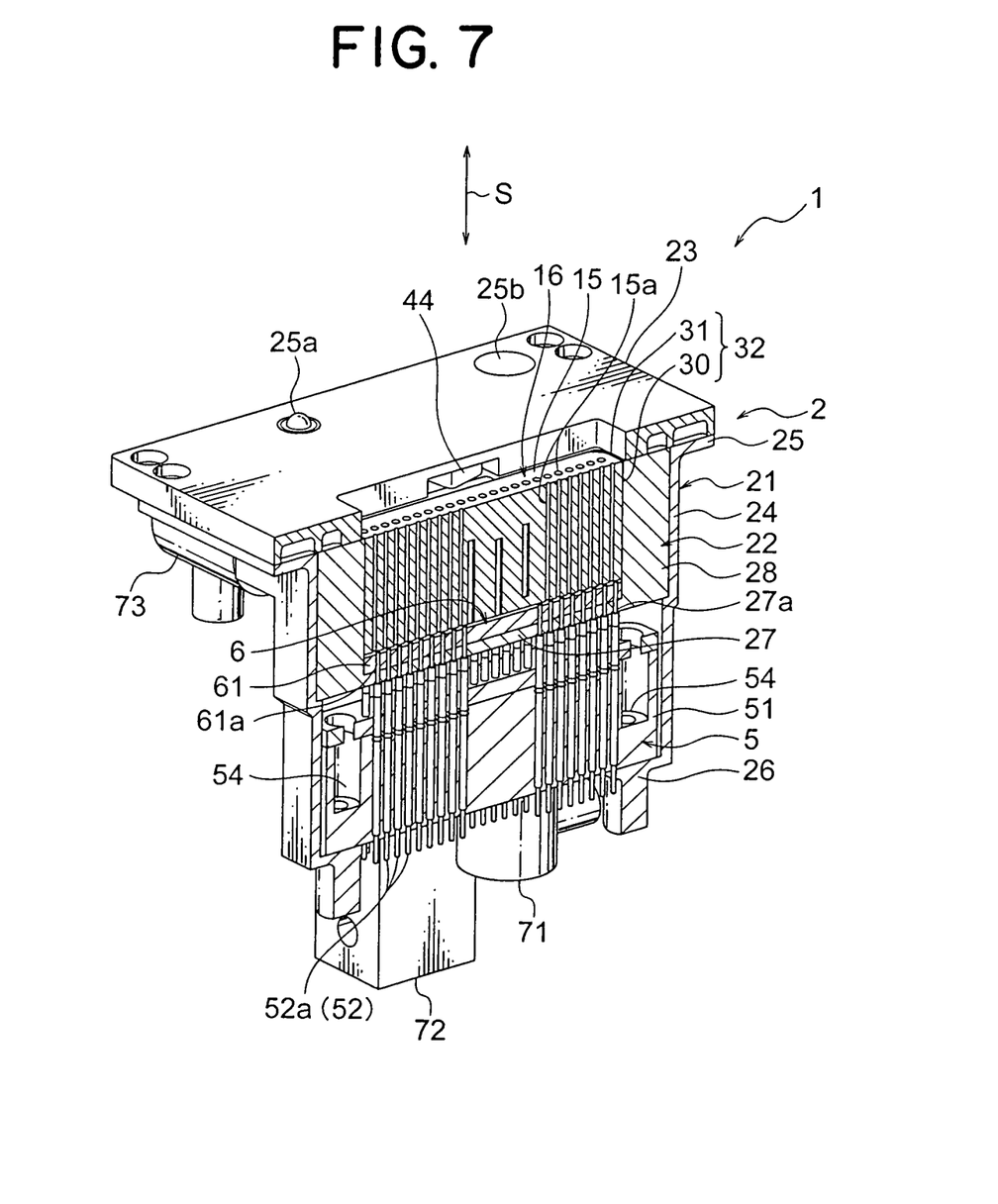
FIG. 7 is a sectional perspective view taken on line VII-VII in FIG. 6.
Figure 10:
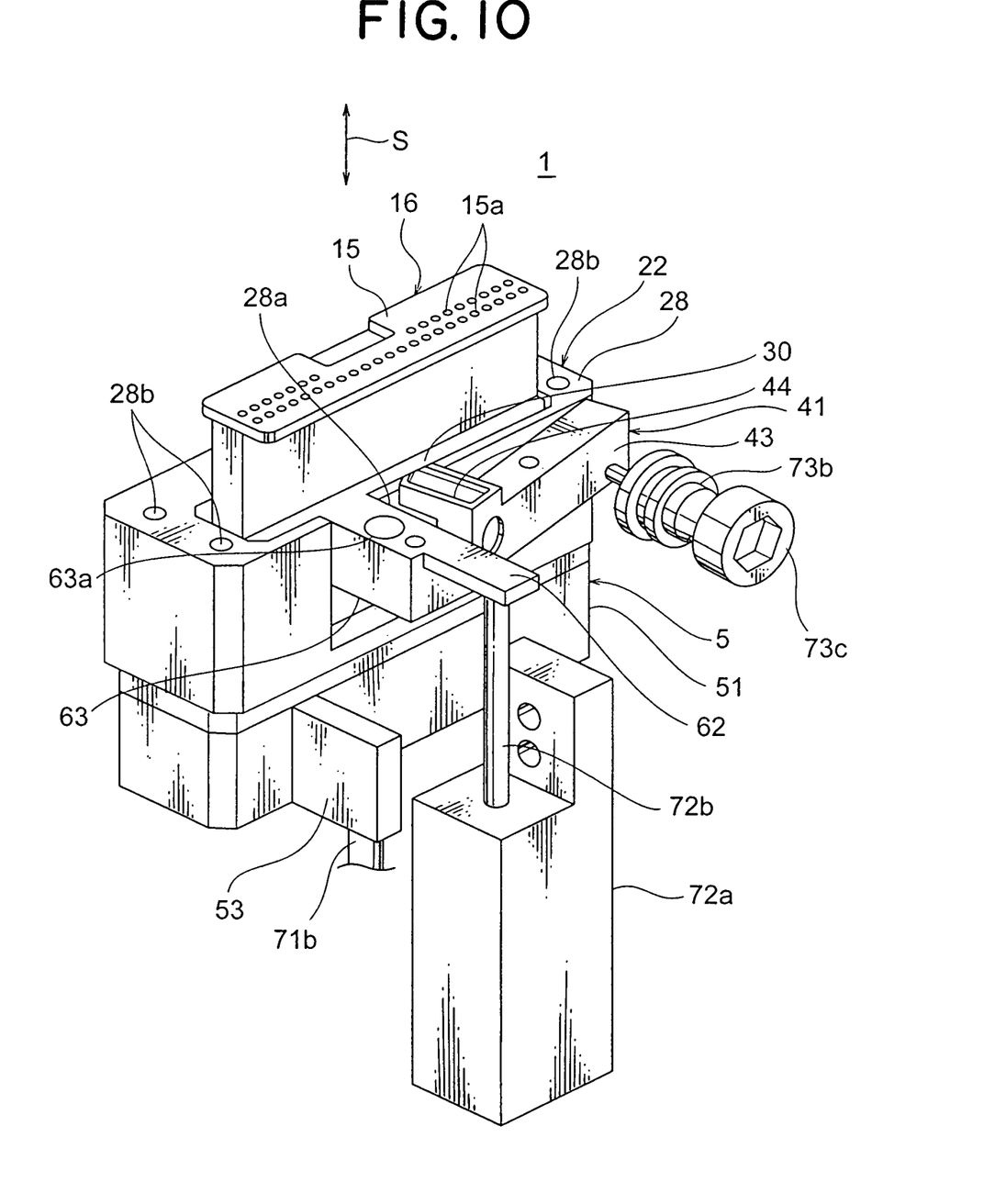
FIG. 10 is a perspective view showing an interior of the conductivity test jig shown in FIG. 8.

According to the holding member 4 as described above, when the connector 16 is not received in the connector receiving hole 30 (namely, the hole 32), the rod 73b is expanded to push the other end of the lever main body 43 against the pushing force of the coil spring. Then, the locking projection 44 is positioned outer side of the connector receiving hole 30 than an inner wall of the connector receiving hole 30 (the locking projection 44 is not projected over the inner wall of the connector receiving hole 30), and the lock lever 41 is released (FIGS. 6 and 10).

Figure 9:
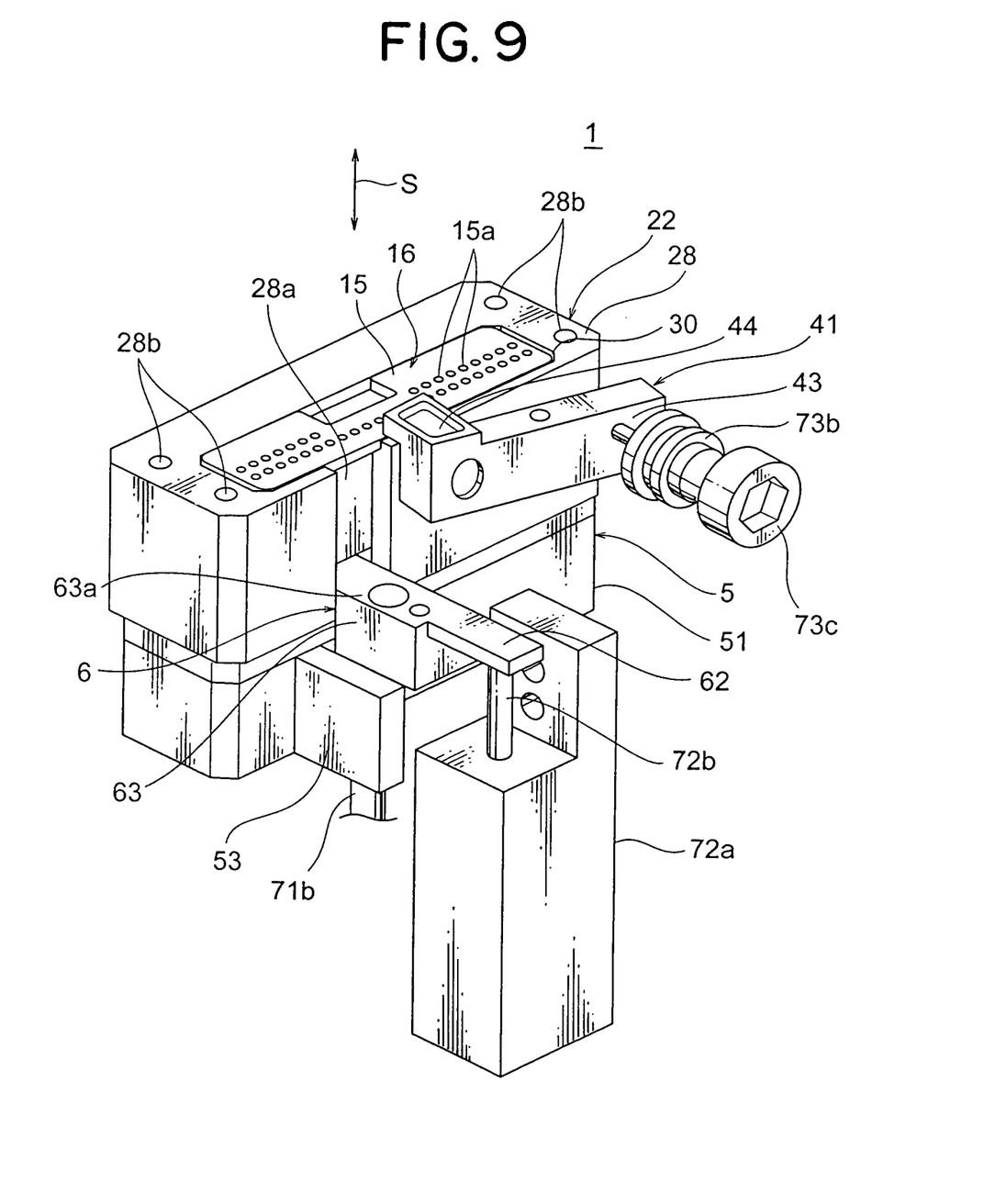
FIG. 9 is a perspective view showing an interior of the conductivity test jig shown in FIG. 4.

Further, according to the holding member 4, when the connector 16 is received in the connector receiving hole 30 (namely, the hole 32), the rod 73b is contracted, and the locking projection 44 is projected over the inner wall of the connector receiving hole 30 toward an interior of the connector receiving hole 30 by the pushing force of the coil spring, and then the lock lever 41 is in a lock state (FIGS. 4 and 9). Then, the holding member 4 holds the connector 16 in the connector receiving hole 30.

As shown in FIG. 2, the conductivity test unit 5 includes: a test unit main body 51; and a conductivity member 52. The test unit main body 51 is made of insulating synthetic resin or the like, and formed in substantially a box shape. The test unit main body 51 is disposed in the receiver 24 of the main body 21. A projecting piece 53 and guide holes 54 are formed on the test unit main body 51.

The projecting piece 53 is formed on an outer wall (side wall) of the test unit main body 51 facing an inner wall of the receiver 24. The projecting piece 53 is projected from the side wall of the test unit main body 51 and parallel to the insertion direction S.

As shown in FIG. 2, the guide holes 54 are formed on both ends of the test unit main body 51 in a width direction. The guide holes 54 penetrate the test unit main body 51 in a height direction thereof (namely, the insertion direction S). The guide holes 54 are continued to the guide holes 28b of the connector receiving member 22. Not-shown guide rods are inserted into the guide holes 54, 28b. The test unit main body 51 (namely, the conductivity test unit 5) is detachably attached to the connector receiving member 22 (later-described connector 16 held in the connector receiving hole 30, namely, the hole 32) disposed on an upper side of the conductivity test unit 5 in the insertion direction S in the receiver 24.

The conductivity member 52 is mounted on the conductivity test unit 5, and composed of a plurality of conductivity pins 52a. Each conductivity pin 52a is made of conductive metal and formed in a pin shape. Each conductivity pin 52a penetrates the test unit main body 51. As shown in FIG. 5, one end of each conductivity pin 52a is projected from an outer wall (upper wall) of the test unit main body 51 facing the connector receiving member 22, and the other end of each conductivity pin 52a is projected from an outer wall (lower wall) of the test unit main body 51 away from the connector receiving member 22.

When the test unit main body 51 (namely, the conductivity test unit 5) is moved close to the connector 16, the conductivity pins 52a are respectively received in the terminal receiving chambers 15a received in the connector receiving hole 30 (namely, the hole 32). The conductivity pins 52a respectively make contact with the terminals of the connector 16 received in the connector receiving hole 30 and electrically connected to the terminals. A not-shown electric wire is connected to the other end of each conductivity pin 52a. These electric wires are connected to the controller 13. Namely, the conductivity test unit 5 is connected to the controller 13.

As shown in FIG. 2, the air cylinder 71 includes: a cylinder main body 71a; a rod 71b projectably and retractably attached to the cylinder main body 71a; and a plug 71c for sealing an interior of the cylinder main body 71a. The cylinder main body 71a is disposed at the lower wall 21b side of the main body 21, and perpendicular to the lower wall 21b. The cylinder main body 71a is parallel to the insertion direction S. A tip of the rod 71b faces the tip of the projecting piece 53 of the conductivity test unit 5.

When the rod 71b is expanded, the tip of the rod 71b pushes the projecting piece 53 of the conductivity test unit 5, and pushes up the conductivity test unit 5 received in the receiver 24 of the main body 21 in the insertion direction S to make the conductivity test unit 5 move close to the connector 16 received in the connector receiving hole 30 (namely, the hole 32).

Further, when the rod 71b is contracted, the conductivity test unit 5 received in the receiver 24 falls down to move away from the connector 16 in the insertion direction S, and is positioned on the locking part 26 of the receiver 24 (initial position). Thus, the air cylinder 71 makes the conductivity test unit 5 detachably contact with the connector 16 in the insertion direction S.

Incidentally, a coil spring for pushing the conductivity test unit 5 toward the initial position in the insertion direction S may be used. In this case, when the rod 71b is expanded, the coil spring is resiliently deformed and the conductivity test unit 5 is pushed up. When the rod 71b is contracted, the resilient force of the coil spring positions the conductivity test unit 5 at the initial position. Therefore, the conductivity test unit 5 is surely returned to the initial position.

Further, the tip of the rod 71b may be connected to the tip of the projecting piece 53 of the conductivity test unit 5. In this case, when the rod 71b is contracted, the conductivity test unit 5 is pulled back to the initial position. Therefore, the conductivity test unit 5 is surely returned to the initial position.

The push-out member 6 is made of insulating synthetic resin or the like. As shown in FIG. 2, the push-out member 6 integrally includes: a push-out board 61; a projection 62; and a block 63. The push-out board 61 is formed in a rectangular plate shape, and a little smaller than the bottom wall of the connector receiving hole 30. Further, insertion holes 61a and a switch-pin hole 61b are formed on the push-out board 61. The conductivity pins 51a are inserted into the insertion holes 61. The switch pin 30a is inserted into the switch-pin hole 61b.

The insertion holes 61a penetrate the push-out board 61. As later described, when the push-out board 61 is received in the connector receiving hole 30, the insertion holes 61a are respectively continued to the insertion holes 27a of the connector receiving member 22. The switch-pin hole 61b is formed on an outer edge of the push-out board 61 and formed in a groove with a semi-circular section.

The projection 62 is formed in a rectangular plate shape, and little narrower than a width of the notch 28a. The projection 62 is extended from the center of the push-out board 61 in a longitudinal direction, and perpendicular to the longitudinal direction. The projection 62 and the push-out board 61 are arranged in the same plane. A base end of the projection 62 is inserted into the notch 28a, and a tip of the projection 62 is projected from the connector receiving member 22.

The block 63 is formed on the center in a longitudinal direction of the projection 62, and projected from an outer wall of the projection 62. A guide hole 63a is formed on the block 63. The guide hole 63a penetrates the block 63 and the projection 62 in the center of the longitudinal direction. The guide hole 63a is formed in a projecting direction of the block 63 (namely, the insertion direction S). A not-shown guide rod is inserted into the guide hole 63a. The push-out member 6 is movable in the insertion direction S.

The push-out board 61 is received in the connector receiving hole 30, and then, the connector 16 is received in the connector receiving hole 30 (namely, the hole 32). Namely, as shown in FIG. 5, the push-out board 61 (the push-out member 6) faces a front wall of the connector 16, and interposed between the connector 16 and the connector receiving member 22 (the jig main body 2) in the insertion direction S.

As shown in FIG. 2, the second air cylinder 72 includes: a cylinder main body 72a; a rod 72b projectably and retractably attached to the cylinder main body 72a; and a plug 72c for sealing an interior of the cylinder main body 72a. The cylinder main body 72a is disposed at the lower wall 21b side of the main body 21, and perpendicular to the lower wall 21b. The cylinder main body 72a is parallel to the insertion direction S. A tip of the rod 72b faces the tip of the projection 62 of the push-out member 6.

When the rod 72b is expanded, the tip of the rod 72b pushes the projection 62 of the push-out member 6, and pushes up the push-out member 6 received in the connector receiving hole 30 in the insertion direction S. By pushing up the push-out member 6, the connector 16 disposed at an upper side of the push-out member 6 is pushed out of the connector receiving hole 30 (namely, the hole 32).

Further, when the rod 72b is contracted, the push-out member 6 received in the connector receiving hole 30 falls down in the insertion direction S, and is positioned on the bottom wall of the connector receiving hole 30 of the connector receiving member 22 (initial position). Thus, the air cylinder 71 moves the push-out member 6 in the insertion direction S.

Incidentally, a coil spring for pushing the push-out member 6 toward the initial position in the insertion direction S may be used. In this case, when the rod 72b is expanded, the coil spring is resiliently deformed and the push-out member 6 is pushed up. When the rod 72b is contracted, the resilient force of the coil spring positions the push-out member 6 at the initial position. Therefore, the push-out member 6 is surely returned to the initial position.

Further, the tip of the rod 72b may be connected to the tip of the projection 62 of the push-out member 6. In this case, when the rod 72b is contracted, the push-out member 6 is pulled back to the initial position. Therefore, the push-out member 6 is surely returned to the initial position.

The controller 13 includes a well-known computer. The controller 13 is connected to the LED 25a, the button 25b, the switch pin 30a, the air cylinders 71, 72, 73 and the like, and controls them and the whole conductivity test apparatus 10.

When the conductivity test is performed with respect to the wiring harness, the controller 13 previously memorizes the conductivity test jig 1 holding the connector 16. When the conductivity test is performed with respect to the wiring harness, the controller 13 turns on the LED 25a of the conductivity test jig 1 holding the connector 16. According to the data from the switch pin 30a, the controller 13 judges whether the connectors 16 are attached to all the conductivity test jigs 1 of which LEDs 25a are turned on. After judging that the connectors 16 are attached to all the conductivity test jigs 1 of which LEDs are turned on, firstly, the controller 13 contracts the rods 73b of the third air cylinders 73 of all the conductivity test jigs 1 of which LEDs are turned on. Then, the controller 13 expands the rods 71b of the air cylinders 71.

Then, the controller 13 sequentially supplies electric current to the terminals of the connectors 16 to check conductivity between the terminals. According to the check result, the controller 13 judges whether the wiring harness under test is defective or not. After the judgement, the controller 13 displays the judging result on a display (not shown), contracts the rods 71b of the air cylinders 71, and expands the rods 73b of the third air cylinders 73. Then, the controller 13 expands the rods 72b of the second air cylinders 72.

Further, according to the data from the button 25b, the controller 13 expands the rod 73b of the third air cylinder 73, then, expands the rod 72b of the second air cylinder 72. Thus, even while the conductivity test is performed, the connector 16 is pulled out from the hole 32 as required.

A method of conductivity test for judging deficiency of the wiring harness using the conductivity test apparatus 10 having the above described structure will be explained with reference to FIGS. 3 to 10. Firstly, the conductivity test apparatus 10 is powered on, and the LED 25a of the conductivity test jig 1 to receive the connector 16 is turned on (see FIG. 3). At this time, the rod 73a of the third air cylinder 73 is expanded, and the lock lever 41 is released. Further, the rod 71b of the air cylinder 71 is contracted, and the conductivity test unit 5 is positioned at the initial position.

Then, an operator inserts the connector 16 into the hole 32 of the conductivity test jig 1 of which LED 25a is turned on, and arranges the wiring harness on the wiring board 12. According to the data from the switch pin 30a, when the conductivity test apparatus 10 judges that the connectors 16 are attached to all the conductivity test jig 1, firstly, the conductivity test apparatus 10 contracts the rods 73b of the third air cylinders 73 of all the conductivity test jig 1, and as shown in FIGS. 4 and 9, rotates the lock levers 41 into a lock state to hold the connectors 16 in the holes 32.

Then, the conductivity test apparatus 10 expands the rod 71b of the air cylinder 71 of every conductivity test jig 1 to push up the conductivity test jig 1, and as shown in FIG. 5, makes the conductivity pins 52a contact the terminals of the connector 16 to test conductivity. After checking the quality of the wiring harness, the conductivity test apparatus 10 displays the result on the display device or the like.

Then, the conductivity test apparatus 10 contracts the rod 71b of the air cylinder 71 of every conductivity test jig 1, and as shown in FIG. 1, positions the conductivity test unit 5 at the initial position to remove the conductivity pins 52a from the terminals of the connector 16. At the same time, the conductivity test apparatus 10 expands the rod 73b of the third air cylinder 73 of every conductivity test jig 1 to rotate the lock lever 41 to a release position as shown in FIG. 6.

Figure 8:
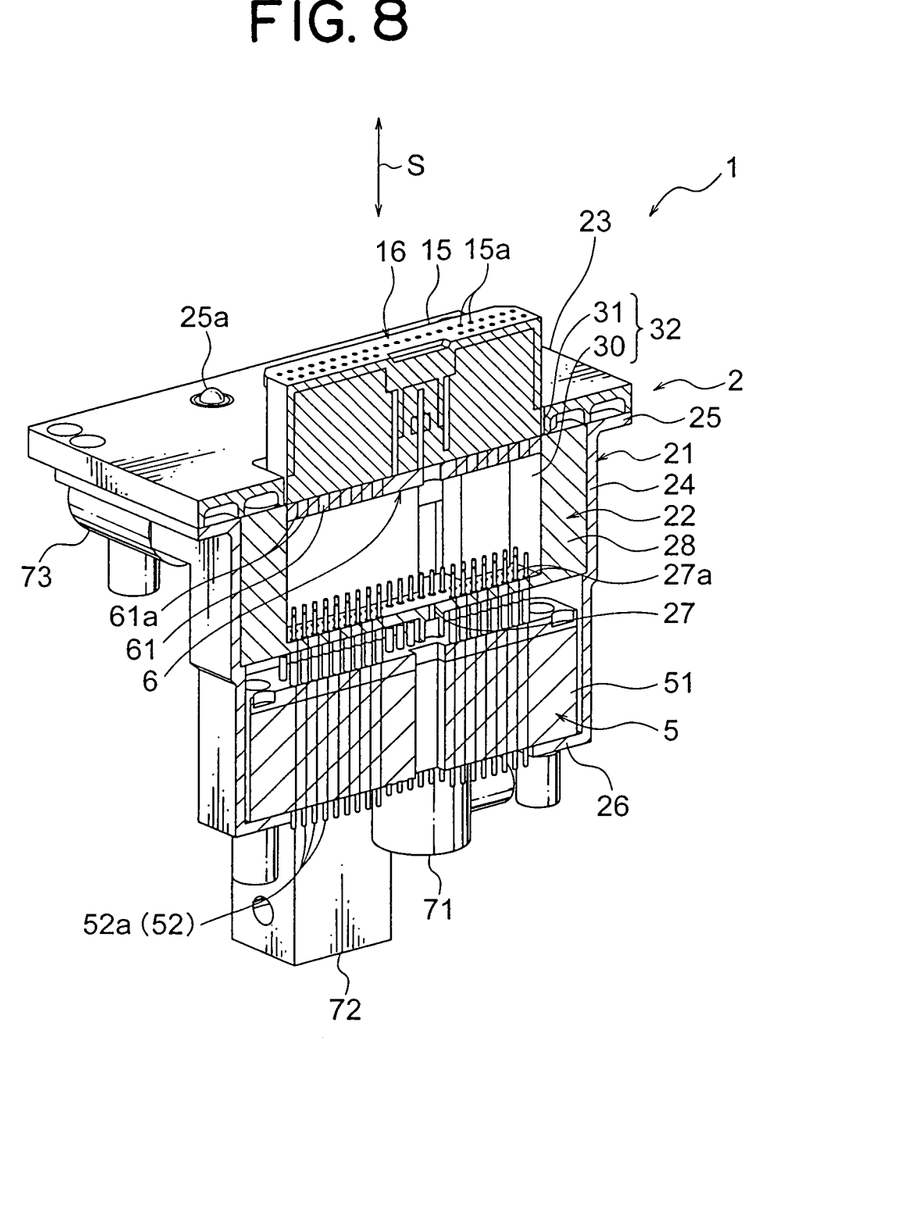
FIG. 8 is a sectional perspective view showing a state that the connector shown in FIG. 7 is pushed out of the hole.

Then, the conductivity test apparatus 10 expands the rod 72b of the second air cylinder 72 of every conductivity test jig 1 to push up the push-out member 6 out of the hole 32 as shown in FIGS. 8 and 10, to push the connector 16 out of the hole 32.

According to this embodiment, because the conductivity test jig 1 has the above-described configuration, after the connector 16 is held in the hole 32, the conductivity test unit 5 is moved close to the connector 16 and the conductivity test is performed. Therefore, when the connector 16 is inserted into the hole 32, the terminals of the connector 16 and the conductivity pins 52a are not burdened so much. Further, the connector 16 is easily attached to the conductivity test jig 1. Moreover, after the conductivity test is ended, the push-out member 6 pushes up the connector 16 to push the connector 16 out of the hole 32. Therefore, when the connector 16 is pushed out of the hole 32, the terminals of the connector 16 and the conductivity pins 52a are not burdened so much. Further, the connector 16 is easily removed from the conductivity test jig 1.

Because the jig main body 2 includes: the main body 21; and the connector-receiving member 22 having the connector receiving hole 30 for receiving the connector 16, the jig main body 2 can accept various types of the connectors 16 by only changing the connector receiving member 22 corresponding to the connector 16 under test. Therefore, the cost of the conductivity test jig 1 can be reduced.

Because the push-out member 6 includes: the push-out board 61 facing the front wall of the connector 16 received in the hole 32 and having insertion holes 61a into which the conductivity member 52 composed of a plurality of conductivity pins 52a is inserted; and the projection 62 projected from the push-out board 61, by pushing up the front wall of the connector 16, the connector 16 is surely pushed up in the insertion direction S while the conductivity pins 52a are not burdened so much.

The air cylinder 71 surely makes the conductivity test unit 5 contact the connector 16 and removes the conductivity test unit 5 from the connector 16 in the insertion direction S.

Because the second air cylinder 72 moves the push-out member 6 in the insertion direction S, the push-out member 6 is surely made contact with the connector 16 and surely removed from the connector 16.

Because the conductivity test apparatus 10 includes: the wiring board 12 on the surface of which the wiring harness is arranged; and the conductivity test jig 1, the terminals of the connector 16 and the conductivity pins 52a are not burdened so much, and the connector 16 is easily attached to and removed from the conductivity test jig 1.

Because the method of conductivity test includes the steps as described above, when the connector 16 is inserted into the hole 32, the terminals of the connector 16 and the conductivity pins 52a are not burdened so much, and the connector 16 is easily attached to the conductivity test jig 1. Further, when the connector 16 is pushed out of the hole, the terminals of the connector 16 and the conductivity pins 52a are not burdened so much, and the connector 16 is easily removed from the conductivity test jig 1.

According to this embodiment, the driving source, the second driving source, and the third driving source are respectively the air cylinders 71, 72, 73. However, the present invention is not limited to this. For example, a solenoid or a motor may be used as the driving source, the second driving source, and the third driving source.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A conductivity test jig for testing conductivity of a terminal of a connector comprising:
   a jig main body having a hole opening on an outer surface thereof for receiving the connector;
   a holding member for holding the connector received in the hole; a conductivity test unit for removeably contacting the connector received in the hole;

a conductivity member mounted on the conductivity test unit for being electrically connected to the terminal when the conductivity test unit moves close to the connector, a first air cylinder wherein the first air cylinder drives a rod that pushes on the conductivity test unit to make the conductivity test jig come in contact with the connector and removes the test unit from the connector by retracting the rod to allow the conductivity test jig to fall back into its initial position; and a push-out member interposed between the connector and the jig main body in the hole in an insertion direction of the connector, a second air cylinder that moves the push-out member in the insertion direction and that pushes the push-out member and connector out of the hole, wherein the push-out member includes:

a push-out board, formed in a plate shape smaller than a bottom wall of the connector receiving hole, facing a front wall of the connector received in the hole and having insertion holes into which the conductivity member having a plurality of conductivity pins is inserted.

2. The conductivity test jig as claimed in claim 1, wherein the jig main body includes:

a main body member; and a connector-receiving member having a concavity for receiving the connector therein.

3. The conductivity test jig as claimed in claim 1, wherein the push-out member further includes:

a projection projected from the push-out board.

4. A conductivity test apparatus comprising: a wiring board on a surface of which a wiring harness is arranged; and the conductivity test jig as claimed in claim 1.

5. A method for testing conductivity of a terminal of a connector comprising:

receiving and holding the connector in a hole in which a push-out member is received, driving, by a first air cylinder, a rod to push a conductivity member to come in contact with the terminal of the connector received in the hole;

testing conductivity of the terminal;

retracting, by a first air cylinder, the rod to allow the conductivity member to return to an initial disposition and remove the conductivity member from the terminal; and moving, by the second air cylinder, the push-out member out of the hole to push the connector out of the hole.

* * * * *